United States Patent [19]
Asanasavest

[11] Patent Number: 6,049,974
[45] Date of Patent: Apr. 18, 2000

[54] MAGNETIC ALIGNMENT APPARATUS AND METHOD FOR SELF-ALIGNMENT BETWEEN A DIE AND A SUBSTRATE

[75] Inventor: Chainarong Asanasavest, Salida, Calif.

[73] Assignee: National Semiconductor Corporation, Santa Clara, Calif.

[21] Appl. No.: 09/069,268

[22] Filed: Apr. 29, 1998

[51] Int. Cl.[7] .................................................. H05K 3/30
[52] U.S. Cl. .............................. 29/832; 29/833; 414/783; 414/816
[58] Field of Search .............................. 29/846, 852, 827, 29/840, 832, 833; 414/783, 816

[56] References Cited

U.S. PATENT DOCUMENTS

| | | |
|---|---|---|
| 3,341,030 | 9/1967 | Engels . |
| 3,612,955 | 10/1971 | Butherus . |
| 3,700,155 | 10/1972 | Hermanns . |
| 3,776,394 | 12/1973 | Miller . |
| 3,868,759 | 3/1975 | Hartleroad . |
| 3,887,997 | 6/1975 | Hartleroad et al. . |
| 3,911,568 | 10/1975 | Hartleroad et al. . |
| 3,911,569 | 10/1975 | Hartleroad et al. . |
| 3,960,279 | 6/1976 | Hartleroad et al. . |

*Primary Examiner*—Carl J. Arbes
*Attorney, Agent, or Firm*—Beyer & Weaver, LLP

[57] ABSTRACT

A magnetic alignment apparatus (20) is provided for aligning a semiconductor die (11) and a packaging substrate (12) to enable aligned mounting therebetween. The alignment apparatus (20) includes a first magnetic device (23) coupled to the die (11) and adapted to generate a first magnetic field (25) oriented relative to a first reference point (26) of the die (11). A second magnetic device (27) is coupled to the substrate (12) and adapted to generate a second magnetic field (28) oriented relative to a second reference point (30) of the substrate (12). The first magnetic field (25) and the second magnetic field (28) cooperate to directionally align the first reference point (26) of the die substantially with the second reference point (30) of the substrate (12).

60 Claims, 5 Drawing Sheets

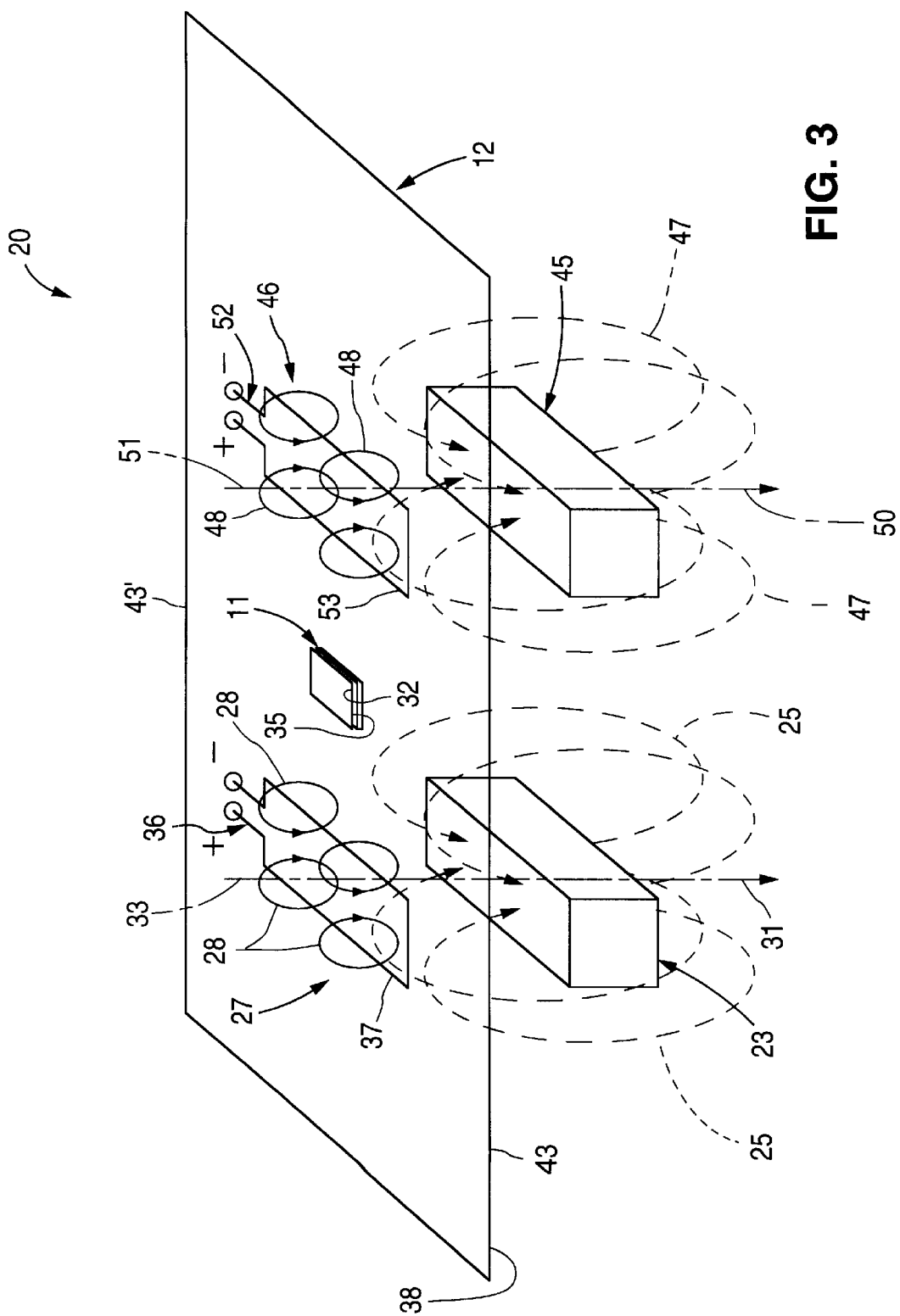

2

MAGNETIC ALIGNMENT APPARATUS AND METHOD FOR SELF-ALIGNMENT BETWEEN A DIE AND A SUBSTRATE

TECHNICAL FIELD

The present invention relates, generally, to semiconductor fabrication and, more particularly, relates to alignment apparatus for enabling alignment between semiconductor dies and packaging substrates during bonding.

BACKGROUND ART

In semiconductor device assembly, a semiconductor chip (or "die") may be bonded directly to a packaging substrate, without the need for a separate leadframe or for separate I/O connectors (e.g. wire or tape). Such chips are typically formed with ball-shaped beads or bumps of solder affixed to their I/O bonding pads such as in a Ball Grid Array (BGA). During packaging, the chip is "flipped" onto its active circuit surface in a manner forming a direct electrical connection between the solder bumps of the chip and conductive traces on a packaging substrate. Semiconductor chips of this type are commonly referred to as "flip chips", and are advantageously of a comparatively reduced size. For example, in current flip chip designs, the semiconductor die may be dimensioned as small as about 0.05×0.05 inch whereas the unbonded solder bumps arranged of a surface thereof may have a diameter on the order of 4 to 5 mils.

Briefly and as shown in FIG. 1, a prior art flip chip packaging assembly 10 may be constructed using conventional fabrication techniques. This packaging assembly 10 includes a semiconductor die 11 which is electrically interconnected to a packaging substrate 12 through solder joints 13. The die 11 is then mechanically mounted to the substrate 12 employing a cured layer 14 of underfill epoxy. This fabrication process, thus, produces a mechanically, as well as electrically, bonded chip assembly.

However, prior to mounting the die 11 to the substrate 12, the array of I/O bonding pads 15 on the die must be properly aligned to the array of conductive traces on the packaging substrate to assure proper attachment therebetween. Due to the small dimensions of the flip chip packaging assemblies 10, the alignment must be accurate within ±1 ml. Such alignment precision is achievable using current alignment technology; however, the alignment assemblies involved are substantially complex in nature, requiring extensive calibration and are prone to breakdown. Maintenance, therefore, is relatively costly and often results in substantial down-time.

These prior art alignment systems are typically separated into two categories which include mechanical alignment systems, and optical alignment systems. Mechanical alignment systems generally include locating pins, and a stopper which physically support the semiconductor die and the packaging substrate for relative movement therebetween. Once the die and the substrate are properly mounted to the respective platform, relative movement commences until mechanical stops or the like are engaged to obstruct further relative movement therebetween. The mechanical stops are calibrated to properly align the array of I/O bonding pads with the conductive traces of the packaging substrate for aligned electrical connection.

In other mechanical alignment systems, optical sensors or precision robotics may be employed to provide precise relative movement for alignment purposes. Examples of these mechanical systems include pneumatic systems with index points, physical robotics systems, fiber optic systems, or the like.

While these mechanical alignment assemblies adequately position the semiconductor die and packaging substrate for alignment purposes, one problem associated with these systems is that they are often mechanically complex involving a substantial number of moving components. As mentioned, these systems must be extensively calibrated to function properly. Once the cooperating components begin to wear, alignment problems occur which in turn require parts replacement and/or re-calibration. Maintenance costs, therefore, tend to be relatively costly. Moreover, the alignment process between the die and the substrate is typically time consuming to achieve since the substrate will be brought over to the bonding site mechanically and the alignment is also done mechanically as well before attach to the die to the substrate.

Another problem associated with these mechanical alignment systems is that the substrate may be physically damaged upon contact with the alignment system moving components. This is particularly true with those alignment systems employing mechanical stops and/or robotics assemblies.

The other conventional alignment system employed to align the die and the substrate involve precision optical sensor techniques to center the flip chip packages. Generally, a plurality of optical sensors and transmitters are deployed at strategic positions about the die and the substrate to facilitate alignment. Upon alignment of the opposed optical sensors, or with a designated reference point, the die and the substrate may be properly aligned when combined with precise mechanical transports. More advanced optical techniques include pattern recognition systems which are adapted to recognize the pattern of solder joint arrays and the conductive trace circuitry of the substrate.

Both optical techniques require complex circuitry, programming, and machinery to advance the optical alignment. Thus, calibration is difficult. These factors, hence, substantially increase fabrication and maintenance costs. Moreover, operation speeds are relatively slow due to the difficulty of implementation, the current optical alignment technology available, as well as the precise nature of the optical alignment.

DISCLOSURE OF INVENTION

Accordingly, it is an object of the present invention to provide an apparatus and method which enables self-alignment between a semiconductor die and a packaging substrate for aligned electrical connection thereof.

Another object of the present invention is to provide a die and substrate alignment apparatus and method which utilizes cooperating magnetic fields to facilitate alignment between the die and the substrate.

Yet another object of the present invention is to provide a magnetic alignment apparatus and method which reduces damage caused by physical contact with the semiconductor die and the packaging substrate.

Still another object of the present invention is to provide a magnetic alignment apparatus and method which improves alignment efficiency between the die and the substrate.

Yet a further object of the present invention is to provide a magnetic alignment apparatus and method which may be retrofit to existing flip-chip bonding machinery.

Still a further object of the present invention is to provide a magnetic alignment apparatus and method which is durable, compact, easy to maintain, has a minimum number of components, cost effective to manufacture, and is easy to use by moderately skilled personnel.

In accordance with the foregoing objects, a magnetic alignment apparatus is provided for aligning a semiconductor die and a packaging substrate to enable aligned mounting therebetween. The alignment apparatus includes a first magnetic device coupled to the die and adapted to generate a first magnetic field oriented relative to a first reference point of the die. A second magnetic device is coupled to the substrate and adapted to generate a second magnetic field oriented relative to a second reference point of the substrate. The first magnetic field and the second magnetic field cooperate to directionally align the first reference point of the die substantially with the second reference point of the substrate.

To facilitate rotational alignment between the die and the substrate about a longitudinal axis extending through the aligned first and second reference points (i.e., the theta ($\theta$) angle), the alignment apparatus further includes a third magnetic device coupled to the die at a location spaced apart from the first magnetic device, and a fourth magnetic device coupled to the substrate at a location spaced apart from the second magnetic device. The third magnetic device is adapted to generate a third magnetic field oriented relative to the second reference point of the die, while the fourth magnetic device is adapted to generate a fourth magnetic field oriented relative to the second reference point of the substrate. The third magnetic field and the fourth magnetic field cooperate, in conjunction with the first magnetic field and the second magnetic field, to directionally align the first reference point of the die substantially with the second reference point of the substrate relative X, Y coordinates and theta ($\theta$) angle.

In one embodiment, the second magnetic device and the fourth magnetic device are provided by inductors each of which includes a wire adapted to substantially extend around a longitudinal axis thereof. Each wire forms a respective loop contained in a plane of the substrate such that a second magnetic field vector of the second magnetic field is substantially coaxially aligned with the respective longitudinal axis of the respective loop, such that and a fourth magnetic field vector of the fourth magnetic field is substantially coaxially aligned with the respective longitudinal axis of the respective loop.

The first magnetic device and the third magnetic device are preferably provided by permanent magnets mounted to a support structure formed to support the semiconductor die thereon. When the first reference point and the second reference point are substantially aligned along the X, Y coordinates and theta ($\theta$) angle, the first permanent magnet device is oriented such that a first magnetic field vector of the first magnetic field is substantially coaxially aligned with a second magnetic field vector of the second magnetic field. Similarly, the third permanent magnet device is oriented such that a third magnetic field vector of the third magnetic field is substantially coaxially aligned with a fourth magnetic field vector of the fourth magnetic field.

In another embodiment, the alignment apparatus includes a first group of first magnetic devices coupled to the die on one side thereof. Each first magnetic device of the first group is adapted to generate a respective first magnetic field each of which is oriented relative to a first reference point and the die. A second group of second magnetic devices is also provided which is coupled to the substrate, and each second magnetic device is adapted to generate a respective second magnetic field. Each second magnetic field is oriented relative to a second reference point of the substrate, and each corresponds to one of the first magnetic devices of the first group. A third group of third magnetic devices is coupled to the die on an opposite side of the first group. Each third magnetic device of the third group is adapted to generate a respective third magnetic field each of which is oriented relative to the first reference point and the die. Finally, a fourth group of fourth magnetic devices is coupled to the substrate. Each fourth magnetic device is adapted to generate a respective fourth magnetic field which is oriented relative to a second reference point of the substrate and each corresponds to one of the third magnetic devices of the third group. The respective first magnetic fields of the first group and the corresponding respective second magnetic fields of the second group, and the respective third magnetic fields of the third group and the corresponding respective fourth magnetic fields of the forth group respectively cooperate to directionally align the first reference point of the die substantially with the second reference point of the substrate relative X, Y coordinates and theta ($\theta$) angle.

Each respective second magnetic device and each respective fourth magnet device is provided by an inductor each including a wire adapted to substantially extend around respective longitudinal axes thereof. Further, each loop of the second group of magnetic devices and of the fourth group of magnetic devices is contained in a plane of the substrate such that, each respective second magnetic field vector of the corresponding second magnetic field is substantially coaxially aligned with a respective longitudinal axis of the respective loop, and each respective fourth magnetic field vector of the corresponding fourth magnetic field is substantially coaxially aligned with a respective longitudinal axis of the respective loop.

A support structure may be provided to support the die at an orientation relative to the first reference point, and formed to support each of the first magnet devices and each of the third magnet devices on opposite sides of the die. Preferably, the support structure includes an alignment device positioned between the support structure and the die which is adapted to align the die relative to the first magnetic field.

In still another embodiment, a method for aligning a die and a substrate is disclosed to enable aligned mounting therebetween. The method includes the steps of A) providing a first magnetic field oriented relative to a first reference point of the die; and B) providing a second magnetic field oriented relative to a second reference point of the substrate. The first magnetic field and the second magnetic field cooperate to directionally align the first reference point of the die substantially with the second reference point of the substrate.

The providing a second magnetic field step (B) is preferably performed by generating a second magnetic field through an inductor having a wire adapted to substantially extend around a longitudinal axis thereof. The present inventive method may further include the step of: forming a loop from the wire such that a second magnetic field vector of the second magnetic field is substantially parallel with and proximate to the longitudinal axis of the loop. This generating step is preferably performed by pulsating a current through the wire to pulsate the second magnetic field.

The alignment method further includes the step of: orienting a first magnet field such that a first magnetic field vector thereof is substantially coaxially aligned with a second magnetic field vector of the second magnetic field when the first reference point and the second reference point are aligned. After the providing a second magnetic field step, the present alignment method includes the step of vibrating at least one of the die and the substrate to facilitate directional alignment between the first magnetic field and the second magnetic field.

Again, to facilitate rotational alignment between the die and the substrate about a longitudinal axis extending through the aligned first and second reference points (i.e., the theta (θ) angle), the alignment method includes the steps of: providing a third magnetic field at a location spaced apart from the first magnetic field and oriented relative to the first reference point of the die; and providing a fourth magnetic field at a location spaced apart from the second magnetic field and oriented relative to the second reference point of the substrate. The third magnetic field and the fourth magnetic field cooperate, collectively with the first magnetic field and the second magnetic field, to directionally align the first reference point of the die substantially with the second reference point of the substrate relative X, Y coordinates and theta (θ) angle.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which:

FIG. 3 is a top perspective, schematic representation, of an alternative embodiment magnetic alignment apparatus of the present invention having a dual magnetic field alignment.

BEST MODE OF CARRYING OUT THE INVENTION

Figure 1:
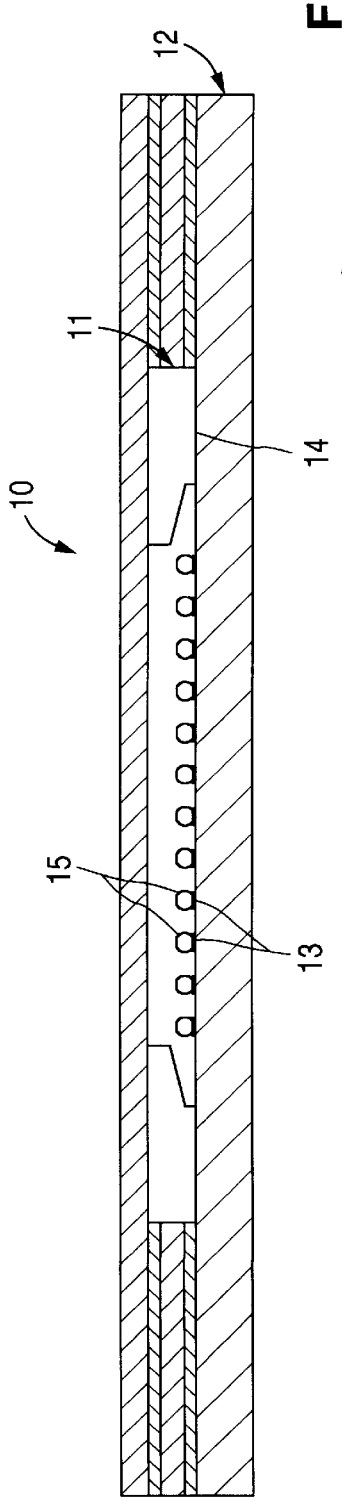
FIG. 1 is a side elevation view, in cross-section, of a flip-chip packaging assembly illustrating the aligned solder joints between the I/O bonding pads of the semiconductor chip and the conductive traces of the packaging substrate.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 2A:
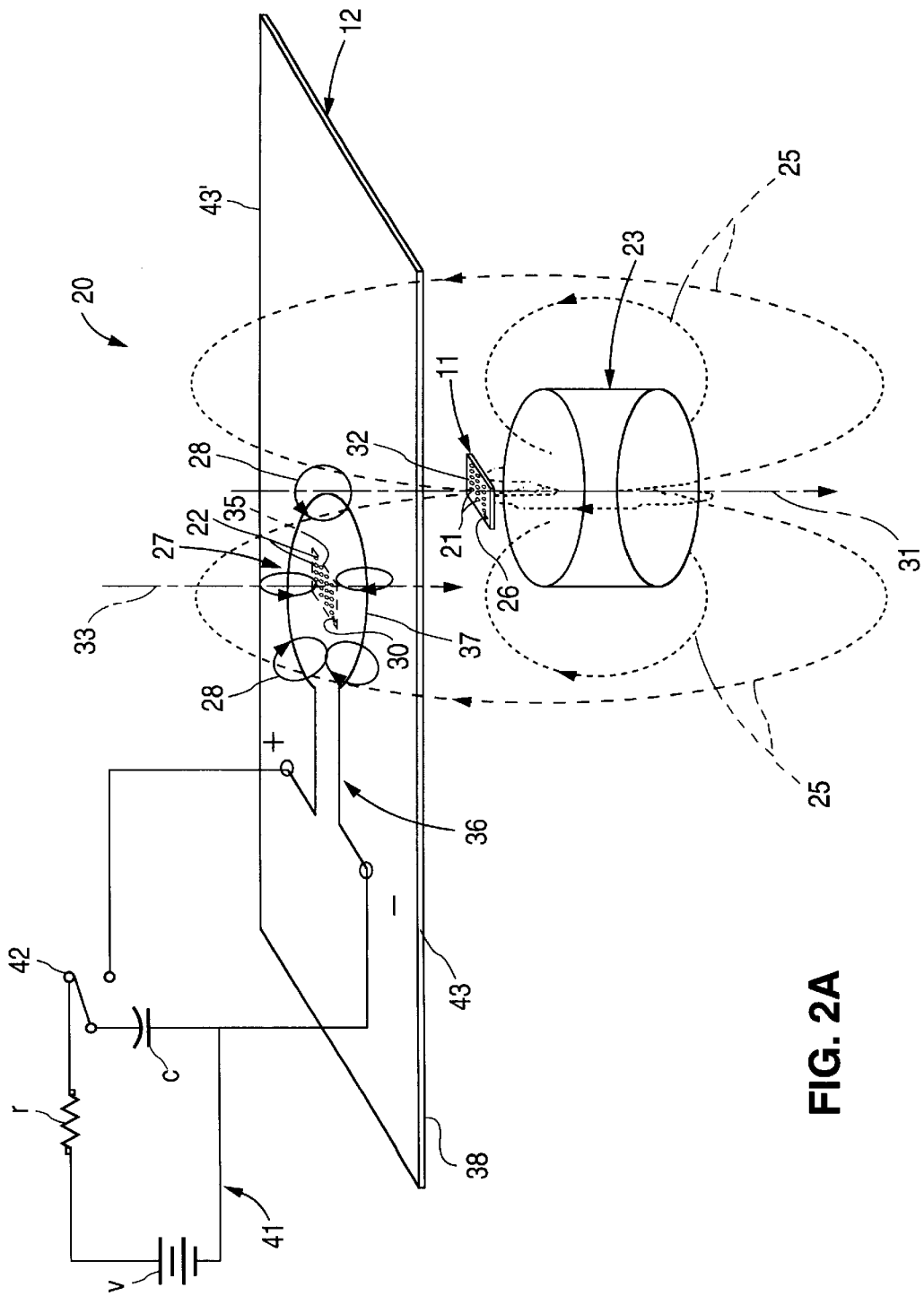
FIGS. 2A and 2B are a sequence of schematic, top perspective views of a magnetic alignment apparatus for a semiconductor die and a packaging substrate constructed in accordance with the present invention and illustrating alignment therebetween.
Figure 2B:
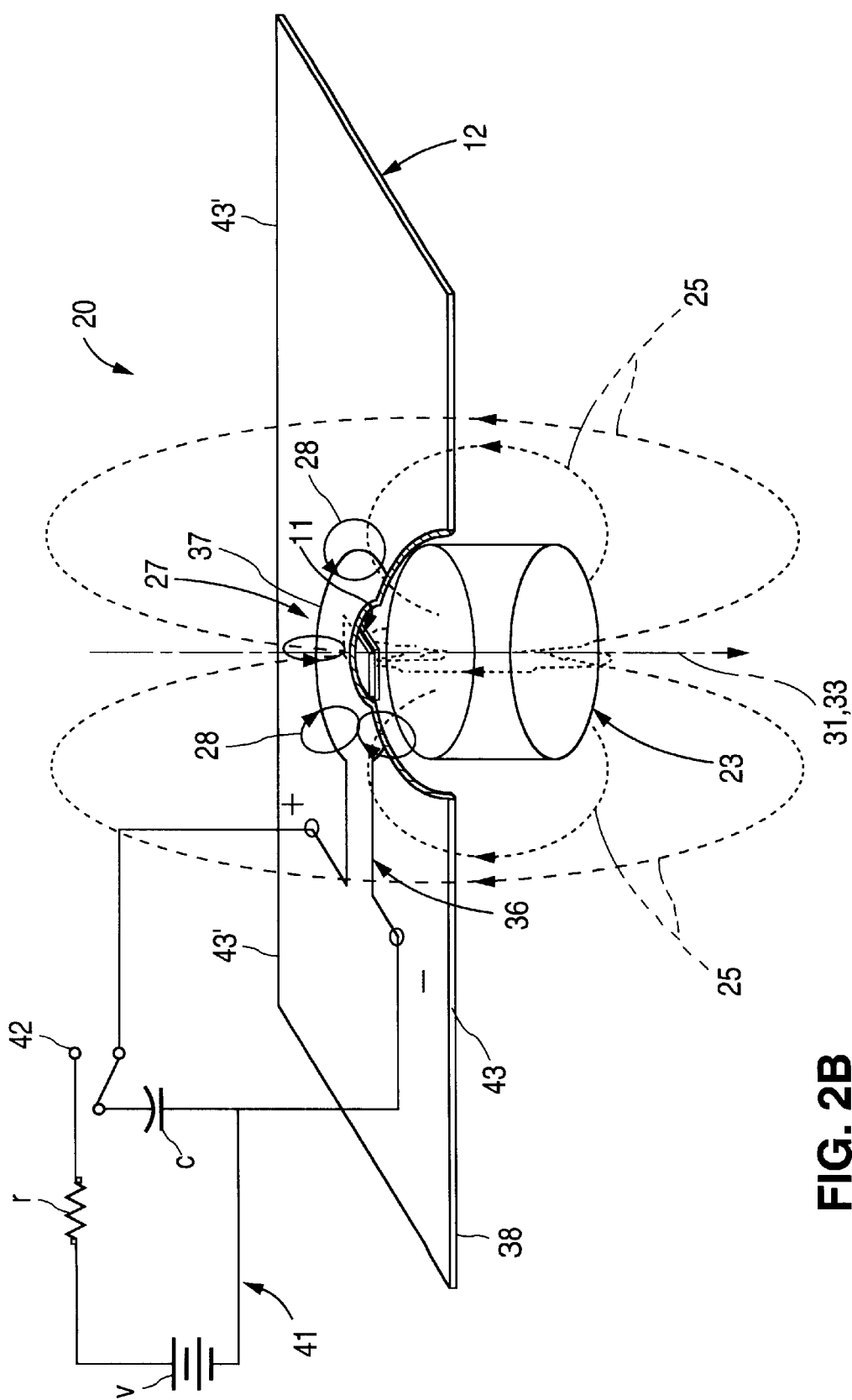

Attention is now directed to FIGS. 2A and 2B where a magnetic alignment apparatus, generally designated 20, is provided for aligning a semiconductor die 11 and a packaging substrate 12 to enable aligned electrical interconnection therebetween. More specifically, the I/O pads 21 of the semiconductor die 11 are to be aligned with the conductive traces 22 of the substrate (e.g., a Printed Circuit Board (PCB)). The alignment apparatus 20 includes a first magnetic device 23 coupled to the die 11 which is adapted to generate a first magnetic field (represented by the first lines of induction 25 (i.e., broken lines)) oriented relative to a first reference point 26 of the die 11. A second magnetic device 27 is coupled to the substrate 12 and adapted to generate a second magnetic field (represented by the second lines of induction 28 (i.e., solid lines)) oriented relative to a second reference point 30 of the substrate 12. The first magnetic field and the second magnetic field cooperate to directionally align the first reference point 26 substantially with the second reference point 30 of the substrate 12, the reference points of which have been predetermined to align the substrate and the die.

Accordingly, the present invention provides an alignment device to facilitate electrical interconnection alignment between a semiconductor die and a packaging substrate which employs magnetic fields to induce self-alignment therebetween. Upon cooperating alignment between the two magnetic fields, the I/O pads of the semiconductor die will be precisely aligned with the conductive traces of the substrate for aligned electrical interconnection therebetween. This alignment technique is not only much more efficient to implement than the prior art mechanical and optical alignment systems, but is equally precise. Moreover, due to the decreased contact with the packaging substrate, damaged caused thereto is substantially reduced.

Briefly, the first magnetic field 25 (FIG. 2A) is strategically positioned and oriented relative to the die 11, while the second magnetic field 28 is strategically positioned and oriented relative to the substrate 12. In essence, any relative reference point may be selected between the magnetic field and the die or substrate. For convenience, however, the first reference point 26 may be positioned along the die 11, while the second reference point 30 may be positioned along the substrate 12. It will be understood, however, that the respective reference points may be situated anywhere in space, relative to the die and the substrate. Moreover, while the die and the substrate are preferably fixed relative the respective magnetic fields, it will be appreciated a configuration of relative movement therebetween could be calculated and performed in a manner providing relative alignment between the die and the substrate electrical connections.

As best viewed in FIG. 2A, the summation of the first lines of induction 25 (i.e., the first magnetic field) of the first magnetic device 23 collectively produce a first magnetic field vector 31. This resulting vector must be properly oriented relative a plane containing the face 32 of the I/O bonding pads 21 of the semiconductor die 11. Accordingly, not only must the first magnetic field 25 be properly positioned relative an X, Y coordinate of the first reference point, but the polar orientation and direction of the first magnetic field vector 31 must be properly positioned and oriented as well. In the preferred embodiment, the first magnetic field vector 31 is oriented substantially perpendicular to the plane containing the face 32 of the I/O pads 21 of the die 11.

Similarly, the summation of the second lines of induction 28 (i.e., the second magnetic field) of the second magnetic device 27 collectively produces a second magnetic field vector 33 properly oriented relative a plane containing the face 35 of the conductive traces 22 of the substrate 12. Again, not only must the second magnetic field 28 be properly positioned relative an X, Y coordinate of the second reference point 30, but the polar orientation and direction of the second magnetic field vector 33 must be properly positioned and oriented as well. Preferably, the second magnetic field vector 33 is oriented substantially perpendicular to the plane containing the face 35 of the conductive traces 22 of the substrate 12.

Importantly, the first magnetic field 25 is oriented relative to the die 11 and the second magnetic field 28 is oriented relative to the substrate 12 such that when the plane of the face 35 of the conductive traces 22 of the substrate 12 is parallel to the plane of the face 32 containing the I/O pads 21 of the die, the first magnetic field vector 31 is positioned parallel to and in the same polar direction as the second magnetic field vector 33.

In accordance with the present invention, upon positioning of the substrate proximate the die such that the first and second magnetic fields are sufficiently close to one another to magnetically interact, the first magnetic field vector 31 and the second magnetic field vector 33 will naturally align coaxially. In turn, the first reference point 26 and the second reference point 30 will align such that the I/O bonding pads of the die properly align with conductive traces of the substrate (FIG. 2B).

In the preferred embodiment, the second magnetic device 27 is provided by an inductor 36 which generates the second magnetic field 28 about a loop 37 formed and dimensioned to polarly orient and position the second magnetic field vector 33 relative the second reference point 30. The inductor is preferably provided by a low resistance, single loop wire adapted to substantially extend around a longitudinal axis thereof which is preferably coaxial with the second magnetic field vector 33. As shown in FIGS. 2A and 2B, the loop 37 is preferably positioned parallel to and substantially coplanar with the planar support wall 38 of the substrate 12 facing the die 11. Hence, the plane containing the loop is also parallel with plane containing the face of the conductive traces 22. Accordingly, the resulting second magnetic field vector 33 is preferably substantially perpendicular to plane of the substrate.

This wire may be mounted to the surface of the substrate using thin copper, or any other thin conductive layer adhesives to minimize the weight increase. This technique would also facilitate retrofitting as well. In other configurations, the wire may be fabricated or molded into the substrate.

Figure 4:
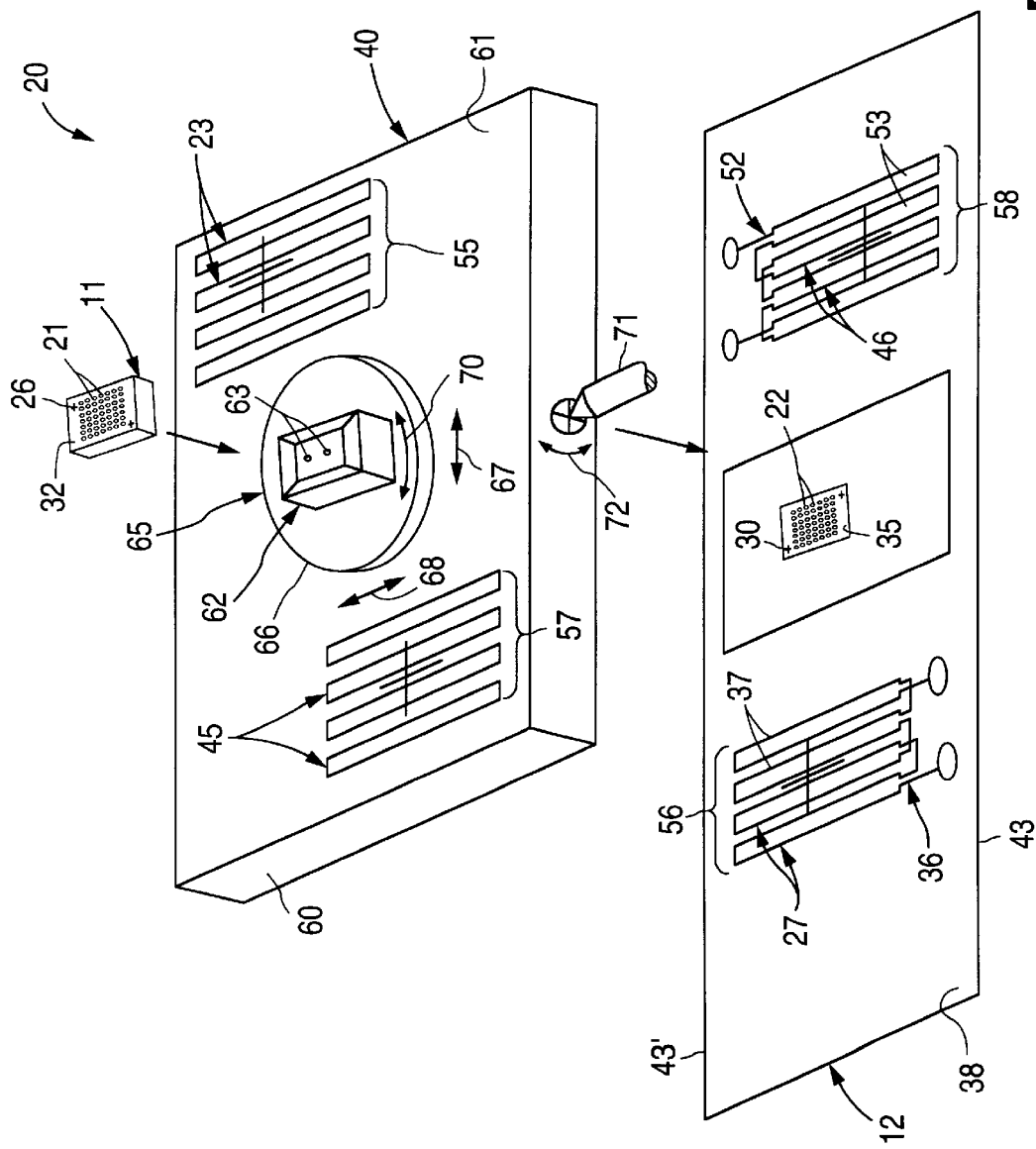
FIG. 4 is an exploded, top perspective view of another alternative embodiment of the present invention employing two groups of magnetic devices for alignment between the semiconductor die and a packaging substrate.

Briefly, the first magnetic field is preferably provided by a permanent magnet which yields a steady magnetic field although the first magnetic device 23 could be provided by an inductor as well. Preferably, this first magnetic field is greater than that of the second magnetic field generated by the second magnetic device. Moreover, as illustrated in FIG. 4, the semiconductor die 11 and the first permanent magnet are mounted to a support structure 40 formed for supporting the die 11 relative the permanent magnet, and hence, the first magnetic field vector 31. This support structure, which will be described in greater detail below, may include a rail assembly (not shown) which physically contacts the support wall 38 of the substrate 12 in a manner appropriately spacing the I/O pads 21 of the die 11 from the conductive traces 22 of the substrate 12, when aligned, to enable electrical interconnection therebetween.

Figure 5:
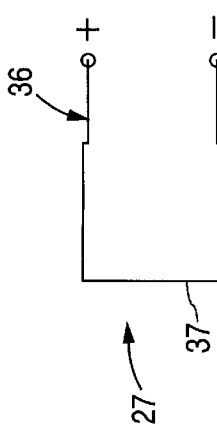
FIG. 5 is an enlarged, top plan view of an alternative embodiment inductor.

Upon applying a current (i) through wire loop 37, the second magnetic field may be selectively generated in the polar direction of the second magnetic field vector 33 to facilitate self-alignment of the components when cooperating with the first magnetic field. Since the generated magnetic field is proportional to the current, increasing the current increases the magnetic flux. Moreover, since i=v/r, where r=resistance and v=voltage, a relatively high current (i) may be provided by utilizing very low resistance wire. This is true even when smaller voltages in the range of only six (6) to forty-eight (48) volts are applied The magnetic flux may be increased by increasing the number of loops as well. Preferably, however, only one loop is necessary which minimizes the weight increase to the substrate and decreases resistance of the wire. Further, the wire loop 37 may be provided by any geometric shape such as a square or rectangular loop shown in FIGS. 3 and 4; however, the position of the magnetic field vector must be identified for alignment purposes. It is further preferable that the shape of the aligned magnetic fields be substantially similar as well. The loop, however, need not extend fully around the longitudinal axis thereof, as long as the loop extends around at least about three-quarters (¾) of the axis, or is sufficient to provide the necessary magnetic field. This concept may best be illustrated in the square loop inductor shown in FIG. 5.

Referring back to FIGS. 2A and 2B, a simple circuit 41 is provided to generate an impulse current (i) through the inductor. Circuit 41 includes a power source having voltage v, a capacitor (c), a resistor (r) and a switch 42. Once the capacitor (c), typically about 1000 $\mu$F to about 4000 $\mu$F or more, is fully charged, switch 42 can be moved to the position of FIG. 2B which generates an impulse current from capacitor (c) by the discharging-effect. Due to the very low impedance of the inductor, the current from the capacitor will be discharged very rapidly as an impulse. As a result, the magnetic field induced by the inductor 36 is very strong which immediately aligns with the steady first magnetic field from the first permanent magnet.

By pulsing the current through the inductor, the generated magnetic field impulse or surge is sufficient to overcome the frictional forces acting between the opposed contacting surfaces. Once the frictional forces are overcome by the magnetic field surge, natural self-alignment with the steady first magnetic field can incur relatively swiftly. In a similar approach, either the die or the substrate, or a combination thereof, may be coupled to a vibrating device to slightly vibrate the components to facilitate alignment.

Another approach to overcoming the friction forces between the substrate and the support surface to facilitate magnetic alignment would be to first reverse the direction of the current applied to the inductor which in turn reverses the polarity of the second magnetic field vector 33. The first magnetic field and the second magnetic field are therefore repulsed from one another which forces the substrate 12 away from the semiconductor die. Subsequently, the current applied to the inductor 36 is again reversed which reverses the polarity of the second magnetic field vector 33 back toward the same direction as the first magnetic field vector 31. The attraction between the two magnetic fields will naturally self-align the magnetic field vectors. In other embodiments, a lubricant or the like, or any other conventional means of reducing friction may be provided between the contacting surfaces of the substrate and the support structure 40.

Figure 6:
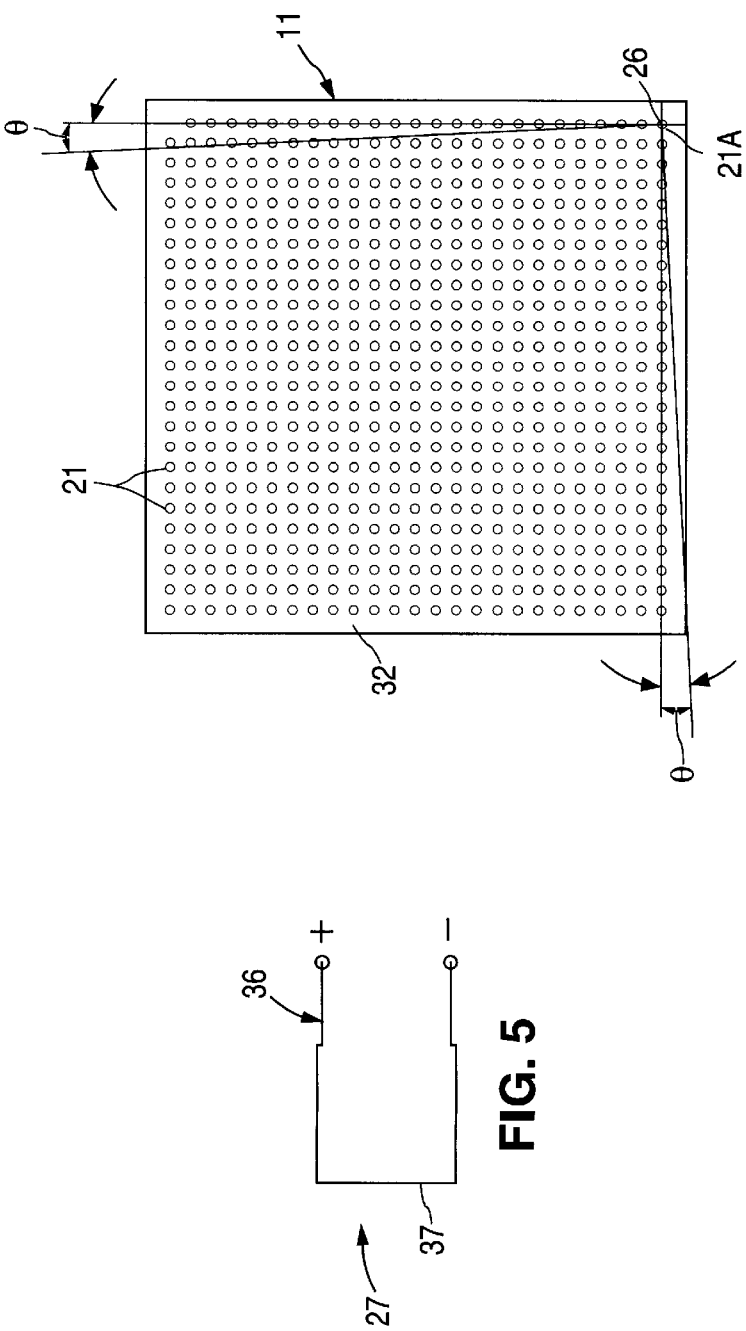
FIG. 6 is an enlarged, bottom plan view of the I/O bond pads of a die illustrating alignment thereof about a theta (θ) angle.

As shown in the die I/O bonding pads 21 in FIG. 6, not only must the first reference point 26 (at first I/O bonding pad 21A, for example) be aligned with the second reference point of the substrate (not shown) along the X and Y coordinates, but must also be aligned in the theta ($\theta$) angle through the aligned reference points. Such alignment assures that all the bonding pads are properly aligned within the tolerance of about ±1.5 degrees.

In one embodiment (not shown), the opposed side edges 43, 43' of substrate 12 may slideably contact the respective inner walls of the above-mentioned rail assembly coupled to the support structure 40 supporting the die. Such contact would enable the substrate to move laterally in only one direction during alignment between the first and second magnetic devices. In this configuration, upon placement of the substrate in contact with the rail assembly, alignment would already occur along one of the X and Y axis, as well as the theta (θ) angle.

In the preferred embodiment, however, to facilitate rotational alignment between the semiconductor die 11 and the packaging substrate 12 about a longitudinal axis extending through the aligned first and second reference points (i.e., the theta (θ) angle), the alignment apparatus 20 of the present invention further includes a third magnetic device 45 (FIGS. 3 and 4) coupled to the die 11 at a location spaced-apart from the first magnetic device 23. A mating fourth magnetic device, generally designated 46, is also provided coupled to the substrate 12 at a location spaced-apart from the second magnetic device 27. The third magnetic device 45 is adapted to generate a third magnetic field (represented by third lines of induction 47) oriented relative to the first reference point 26 of the die 11, while the fourth magnetic device 46 is adapted to generate a fourth magnetic field (represented by fourth lines of induction 48) oriented relative to the second reference point 30 of the substrate 12. The third magnetic field 47 and the fourth magnetic field 48 cooperate, in conjunction with the magnetic alignment between the first magnetic field 25 and the second magnetic field 28, to directionally align the first reference point 26 of the die 11 substantially with the second reference point 30 of the substrate 12 relative the X, Y coordinates and theta (θ) angle.

The two spaced-apart areas of alignment, relative to the aligned reference points, align the components about the theta (θ) angle (FIG. 6). Accordingly, the alignment between the third magnetic field with the fourth magnetic field further assures that the I/O bonding pads 21 of the die and the corresponding conductive traces 22 of the substrate are aligned in the theta (θ) direction as well. Similar to the orientation of the first magnetic field and second magnetic field, the summation of the third and fourth magnetic fields 47, 48 collectively produce a third magnetic field vector 50 and a fourth magnetic field vector 51, respectively. The third magnetic field vector 50 is preferably oriented substantially perpendicular to the plane containing the face 32 of the I/O pads 21 of the die 11, while the fourth magnetic field vector 51 is preferably oriented substantially perpendicular to the plane containing the face 35 of the conductive traces 22 of the substrate 12. Hence, the resulting third and fourth magnetic field vectors are preferably substantially parallel to the first and second magnetic field vectors 31, 33, as well. It will be appreciated, however, that while the polar orientation and direction of the third and the fourth magnetic field vectors 50, 51 must be substantially the same as one another, and may be parallel to the first and second magnetic field vectors 31, 33, the polar directions need not be the same as the first and second magnetic field vectors. That is, the aligned first and second magnetic fields may face one direction while the aligned third and fourth magnetic fields may face the opposite direction.

In the preferred embodiment, the fourth magnetic device 46 is provided by an inductor 52 while the third magnetic device is preferably provided by a permanent magnet generating a steady magnetic. The fourth inductor 52 generates the fourth magnetic field 48 about a loop 53 formed and dimensioned to polarly orient and position the fourth magnetic field vector 51 relative to the second reference point 30. Similar to the second inductor 36, the fourth inductor 52 is preferably provided by a low resistance, single loop wire adapted to substantially extend around a longitudinal axis thereof which is preferably coaxial with the fourth magnetic field vector 51. Each wire loop, accordingly, is formed such that when the die 11 and substrate 12 are properly aligned, the first magnetic field vector 31 of the first magnetic field 25 is substantially coaxially aligned with the second magnetic field vector 33 of the second magnetic field 28, and the third magnetic field vector 50 of the third magnetic field 47 is substantially coaxially aligned with fourth magnetic field vector 51 of the fourth magnetic field 48.

While it is preferable to position the aligned first and second magnetic device pair on one side of the aligned die and substrate, and the aligned third and fourth magnetic device pair on an opposite side of the aligned die and substrate, it will be understood that the aligned pairs of magnetic devices may be positioned on the same side of the die. This is true as long as the first magnetic field vector 31 and the third magnetic field vector 50, as well as the second magnetic field vector 33 and the fourth magnetic field vector 51, are oriented substantially coaxial one another when contained in the same plane.

Moreover, while the first and third magnetic devices, and the second and fourth magnetic devices are positioned relative the second reference point, it will be appreciated that both sets of magnets may be positioned relative other or their own independent reference point. For example, the first reference point of the first magnetic device may be positioned where the desired center of the first magnetic field is to be positioned relative the die, while a third reference point of the third magnetic device may be positioned where the desired center of the third magnetic field is to be positioned relative the die.

Referring now to FIG. 4, another alternative embodiment of the present invention is illustrated which further refines the magnetic alignment accuracy between the I/O bonding pads 21 of the semiconductor die 11 and the conductive traces 22 of the packaging substrate 12. The alignment apparatus 20 of this configuration includes a first group 55 of first magnetic devices 23 coupled to the die 11 on one side thereof. Each first magnetic device 23 of the first group 55 is adapted to generate a respective independent first magnetic field (not shown) each of which is oriented relative to a first reference point 26 and the die 11. In accordance with the present invention, a second group 56 of second magnetic devices 27 is also provided which is coupled to the substrate 12, and each second magnetic device 27 is adapted to generate a respective independent second magnetic field (not shown). Each second magnetic field is oriented relative to a second reference point 30 of the substrate 12, and each second magnetic device corresponds to one of the first magnetic devices of the first group. A third group 57 of third magnetic devices 45 are coupled to the die 11 on an opposite side of the first group 55. Each third magnetic device 45 of the third group is adapted to generate a respective independent third magnetic field (not shown) each of which is oriented relative to the first reference point 26 and the die. Finally, a fourth group 58 of fourth magnetic devices 46 are coupled to the substrate 12. Each fourth magnetic device 46 is adapted to generate a respective independent fourth magnetic field (not shown) which is oriented relative to a second reference point 30 of the substrate 12 and each fourth magnetic device 46 corresponds to one of the third magnetic devices 45 of the third group 57.

In accordance with the present invention, the respective first magnetic fields of the first group 55 and the corresponding respective second magnetic fields of the second group 56, together with the respective third magnetic fields of the third group 57 and the corresponding respective fourth magnetic fields of the fourth group 58, respectively cooperate to directionally align the first reference point 26 of the die 11 substantially with the second reference point 30 of the substrate 12 relative to the X, Y coordinates and theta (θ) angle. Hence, these plurality of aligned magnetic devices enable increased alignment accuracy due to the refined alignment parameters as compared to a single pair of aligned magnetic devices above discussed. When properly calibrated, each additional magnetically aligned pair of magnetic devices incrementally refine the alignment accuracy. Thus, while four magnetic devices are illustrated in each group, it will be understood that any number magnetic devices may be included.

Each respective second magnetic device 27 and each respective fourth magnet device 46 are preferably provided by inductors 36, 52 with each including a conductive wire adapted to substantially extend around a respective longitudinal axis thereof. FIG. 4 illustrates that each magnetic device 27, 46 may be provided by a series of loops 37, 53 formed from a single wire. Each loop 37, 53, however, may be independently formed as well. Additionally, each loop of the second group 56 of second magnetic devices 27 and of the fourth group 58 of fourth magnetic devices 46 is contained in a plane of the substrate 12 which substantially contains the face 35 of the conductive traces 22. Each respective second magnetic field vector (not shown) of the corresponding second magnetic field, therefore, is substantially parallel to one another and substantially perpendicular to the plane the face 35 of the conductive traces 22. Similarly, each respective fourth magnetic field vector (not shown) of the corresponding fourth magnetic field is substantially parallel one another and substantially perpendicular to the plane. Moreover, each magnetic field vector is preferably substantially coaxially aligned with the respective longitudinal axis of the respective loop.

The first group 55 of first magnetic devices 23 and the third group of third magnetic devices 45 are preferably provided by permanent magnets mounted to support structure 40 which is further formed to support the semiconductor die 11 thereon. As above-discussed, however, the magnetic fields may be generated by inductors as well. When the first reference point 26 and the second reference point 30 are substantially aligned along the X, Y coordinates and theta (θ) angle, each first permanent magnetic device 23 is oriented such that a corresponding first magnetic field vector thereof (not shown) is substantially coaxially aligned with a respective second magnetic field vector (not shown) of the second magnetic field, and each respective third magnet field is oriented such that a corresponding third magnetic field vector (not shown) is substantially coaxially aligned with a respective fourth magnetic field vector (not shown) of the fourth magnetic field.

The support structure 40 is preferably provided which releasably retains the semiconductor die 11 relative to the first and third magnetic devices 23, 45 for bonding to the substrate. The support structure 40 preferably includes a base portion 60 defining a planar support surface 61 upon which the first and third magnetic devices 23, 45 are inset flush therewith. A collet device 62 is mounted atop the support surface 61 which releasably mounts the die to the support structure. The die collet device 62 may be calibrated relative to the first and/or third magnetic devices so that the I/O bonding pads 21 are properly positioned relative to the first reference point 26. This, to some extent, depends upon the accuracy of the cut die dimensions which enable the placement of the die 11 in the collet device 62 to be accurately reproduced.

The die 11 is preferably releasably retained in the collet device 62 through vacuum holes 63 in the collet which create a vacuum or the like when the back of the die is placed thereagainst. Other conventional mounting techniques may be employed as well.

To further calibrate the secured die 11 relative to the first and third magnetic devices, a fine tune alignment device 65 may be included for relative movement between the secured die 11 and the base portion 60. As best shown in FIG. 4, the fine tune alignment device 65 includes a support member 66 fixedly mounted to the collet device 62 and moveably mounted to the base portion 60. This coupling to the base portion enables fine tuned movement in the X and Y direction (arrows 67, 68), as well as rotational motion (arrow 70) about the Z axis (i.e., for theta (θ) alignment). Therefore, the fine tune alignment device 65 provides incremental fine tuned movement of the die relative the first and fourth magnetic field vectors. It will be appreciated, of course, that the fine tune alignment could be coupled to the magnetic devices as well.

Once the semiconductor die 11 is secured and aligned relative to the support structure 40, a pivot arm 71 may be included to rotate or flip (in the direction of arrow 72) the support structure about 180° to position the I/O bonding pads 21 of the die 11 in proximity to and facing the conductive traces 22 of the substrate 12. This mechanical motion preliminarily aligns the first magnetic devices 23 of the support structure 40 with the corresponding second magnetic devices 27, and preliminarily aligns the third magnetic devices 45 with the corresponding fourth magnetic devices 46. Thus, the cooperating magnetic devices are positioned sufficiently close to one another to enable the respective magnetic fields to magnetically interact such that the attractive forces therebetween align the magnetic devices along the respective magnetic field vectors. Accordingly, upon the application of an impulse current (i) through the second inductor 36 and the fourth inductor 52, the second magnetic fields and the fourth magnetic fields, respectively, may be instantaneously generated. In response, first magnetic fields and the third magnetic fields generated by the upper positioned first permanent magnets 23 and the upper positioned third permanent magnets 45 magnetically attract the substrate 12 frictionlessly upward and into magnetic alignment with the die. The only friction forces applied, therefore, is the physical contact between the conductive traces of the substrate and the corresponding I/O bonding pads 21 of the die.

Briefly, while the support structure 40 is described in connection with the multiple magnetic device embodiment, it will be appreciated this support structure 40 is equally applicable to any of the embodiments disclosed herein without departing from the true spirit and nature of the present invention.

In another aspect of the present invention which is apparent from the description, a method is provided for aligning a die 11 and a substrate 12 to enable aligned mounting therebetween. The method includes the steps of A) providing a first magnetic field 25 oriented relative to a first reference point 26 of the die 11; and B) providing a second magnetic field 28 oriented relative to a second reference point 30 of the substrate 12. The first magnetic field 25 and the second magnetic field 28 cooperate to directionally align the first reference point 26 of the die 11 substantially with the second reference point 30 of the substrate 12.

The providing a second magnetic field step (B) is preferably performed by generating a second magnetic field 28 through an inductor 36 having a wire adapted to substantially extend around a longitudinal axis thereof. The generating step of the present invention may further be performed by pulsating a current through the wire to pulsate the second magnetic field 28.

The wire preferably forms at least three-quarters (¾) of a loop 37 which is placed substantially in a plane of the substrate. The loop is further formed such that a second magnetic field vector 33 of the second magnetic field 28 is substantially parallel with and proximate to the longitudinal axis of the loop 37. More preferably, the forming step is performed by forming the second magnetic field vector 33 substantially coaxial with the longitudinal axis of the loop 37.

The alignment method further includes the step of: orienting the first magnet field such that a first magnetic field vector 31 thereof is substantially coaxially aligned with a second magnetic field vector 33 of the second magnetic field 28 when the first reference point 26 and the second reference point 30 are aligned. After the providing a second magnetic field step, the present alignment method includes the step of vibrating at least one of the die and the substrate to facilitate directional alignment between the first magnetic field and the second magnetic field.

To support the semiconductor die 11, the present inventive method further includes the step of providing a support structure 40 formed to support the die 11 at an orientation relative the first reference point 26, and relative the first magnetic field 25. Moreover, the method includes mounting the die 11 to the support structure 40; and aligning the die 11 relative to the first magnetic field 25 through an alignment device 65 positioned between the support structure 40 and the die 11.

To align the die and the substrate about the theta (θ) angle, the alignment method includes the steps of: (C) providing a third magnetic field 47 at a location spaced apart from the first magnetic field 25 and oriented relative to the first reference point 26 of the die 11; and (D) providing a fourth magnetic field 48 at a location spaced apart from the second magnetic field 28 and oriented relative to the second reference point 30 of the substrate 12. The third magnetic field 47 and the fourth magnetic field 48 cooperate, collectively with magnetic alignment between the first magnetic field 25 and the second magnetic field 28, to directionally align the first reference point 26 of the die substantially with the second reference point 30 of the substrate relative to the X, Y coordinates and theta (θ) angle.

Similarly, the providing a second magnetic field step (B) is performed by generating a second magnetic field 28 through a second inductor 36 having a wire adapted to substantially extend around a longitudinal axis thereof, and the providing a fourth magnetic field step (D) is performed by generating a fourth magnetic field through a fourth inductor 52 having a wire adapted to substantially extend around a longitudinal axis thereof. The generating a second magnetic field step and the generating a fourth magnetic field step may each performed by pulsating a current through the respective wire to pulsate the second magnetic field and the fourth magnetic field.

The providing a first magnetic field step may also be performed by generating a first magnetic field through a first inductor having a wire adapted to substantially extend around a longitudinal axis thereof, and the providing a third magnetic field step is performed by generating a third magnetic field through a third inductor having a wire adapted to substantially extend around a longitudinal axis thereof.

What is claimed is:

1. A method for aligning a die and a substrate to enable aligned mounting therebetween comprising the steps of:

providing a first magnetic field oriented relative to a first reference point of the die; and coupling an inductor wire to said substrate in a manner extending around a longitudinal axis thereof to selectively generate a second magnetic field oriented relative to a second reference point of the substrate such that said first magnetic field and said second magnetic field cooperate to directionally align the first reference point of the die substantially with the second reference point of the substrate.

2. The method for aligning the die and the substrate as defined in claim 1 wherein, said wire forms at least about three-quarters of a loop.

3. The method for aligning the die and the substrate as defined in claim 2 further including the step of:

placing said loop substantially in a plane of said substrate.

4. The method for aligning the die and the substrate as defined in claim 3 further including the step of:

forming said loop such that a second magnetic field vector of said second magnetic field is substantially parallel with and proximate to the longitudinal axis of said loop.

5. The method for aligning the die and the substrate as defined in claim 1 wherein, said coupling step is performed by pulsating a current through the wire to pulsate the second magnetic field.

6. The method for aligning the die and the substrate as defined in claim 2 wherein, said forming step is performed by forming the second magnetic field vector of said second magnetic field substantially coaxial with the longitudinal axis of said loop.

7. The method for aligning the die and the substrate as defined in claim 1 further including the step of:

providing a support structure formed to support said die at an orientation relative said first reference point, and relative said first magnetic field.

8. The method for aligning the die and the substrate as defined in claim 7 further including the step of:

mounting the die to the support structure; and aligning the die relative to said first magnetic field through an alignment device positioned between the support structure and the die.

9. The method for aligning the die and the substrate as defined in claim 7 wherein, said first magnetic field is provided by a permanent magnet mounted to said support structure.

10. The method for aligning the die and the substrate as defined in claim 9 further including the step of:

orienting said first permanent magnet such that a first magnetic field vector of said first magnetic field is substantially coaxially aligned with a second magnetic field vector of said second magnetic field when said first reference point and said second reference point are aligned.

11. The method for aligning the die and the substrate as defined in claim 1 further including the step of:

after the providing a second magnetic field step, vibrating at least one of the die and the substrate to facilitate directional alignment between said first magnetic field and said second magnetic field.

12. The method for aligning the die and the substrate as defined in claim 5 further including the step of:

after the providing a second magnetic field step, vibrating at least one of the die and the substrate to facilitate directional alignment between said first magnetic field and said second magnetic field.

13. The method for aligning the die and the substrate as defined in claim 1 further including the step of:

providing a third magnetic field at a location spaced apart from said first magnetic field and oriented relative to said first reference point of the die; and providing a fourth magnetic field at a location spaced apart from said second magnetic field and oriented relative to said second reference point of the substrate such that said third magnetic field and said fourth magnetic field cooperate, collectively with said first magnetic field and said second magnetic field, to directionally align the first reference point of the die substantially with the second reference point of the substrate relative X, Y coordinates and theta (θ) angle.

14. A method for aligning a die and a substrate to enable aligned mounting therebetween comprising the steps of:

providing a first magnetic field oriented relative to a first reference point of the die;

providing a second magnetic field oriented relative to a second reference point of the substrate such that said first magnetic field and said second magnetic field cooperate to directionally align the first reference point of the die substantially with the second reference point of the substrate;

providing a third magnetic field at a location spaced apart from said first magnetic field and oriented relative to said first reference point of the die; and providing a fourth magnetic field at a location spaced apart from said second magnetic field and oriented relative to said second reference point of the substrate such that said third magnetic field and said fourth magnetic field cooperate, collectively with said first magnetic field and said second magnetic field, to directionally align the first reference point of the die substantially with the second reference point of the substrate relative X, Y coordinates and theta (θ) angle.

15. The method for aligning the die and the substrate as defined in claim 14 wherein, said providing a second magnetic field step is performed by generating a second magnetic field through a second inductor having a wire adapted to substantially extend around a longitudinal axis thereof, and said providing a fourth magnetic field step is performed by generating a fourth magnetic field through a fourth inductor having a wire adapted to substantially extend around a longitudinal axis thereof.

16. The method for aligning the die and the substrate as defined in claim 15 wherein, each said wire substantially forms a respective loop contained in a plane of said substrate such that a second magnetic field vector of said second magnetic field is substantially coaxially aligned with the respective longitudinal axis of the respective loop, and a fourth magnetic field vector of said fourth magnetic field is substantially coaxially aligned with the respective longitudinal axis of the respective loop.

17. The method for aligning the die and the substrate as defined in claim 15 wherein, said generating a second magnetic field step and said generating a fourth magnetic field step are each performed by pulsating a current through the respective wire to pulsate the second magnetic field and the fourth magnetic field.

18. The method for aligning the die and the substrate as defined in claim 16 wherein, said first magnetic field is provided by a first permanent magnet, and said third magnetic field is provided by a third permanent magnet.

19. The method for aligning the die and the substrate as defined in claim 15 wherein, said providing a first magnetic field step is performed by generating a first magnetic field through a first inductor having a wire adapted to substantially extend around a longitudinal axis thereof, and said providing a third magnetic field step is performed by generating a third magnetic field through a third inductor having a wire adapted to substantially extend around a longitudinal axis thereof.

20. A magnetic alignment apparatus for aligning a die and a substrate to enable aligned mounting therebetween, said alignment apparatus including:

a first magnetic device coupled to the die and adapted to generate a first magnetic field oriented relative to a first reference point of the die; and an inductor wire coupled to said substrate and extending around a longitudinal axis thereof to selectively generate a second magnetic field oriented relative to a second reference point of the substrate, said first magnetic field and said second magnetic field cooperating to directionally align the first reference point of the die substantially with the second reference point of the substrate.

21. The magnetic alignment apparatus according to claim 20 further including:

a current generating device adapted to generate a pulsating current through the inductor wire to pulsate the second magnetic field.

22. The magnetic alignment apparatus according to claim 20 wherein, said wire forms at least about three-quarters of a loop.

23. The magnetic alignment apparatus according to claim 22 wherein, said loop is contained in a plane of said substrate.

24. The magnetic alignment apparatus according to claim 23 wherein, said loop is formed and dimensioned such that a second magnetic field vector of said first magnetic field are substantially coaxial with the longitudinal axis of said loop.

25. The magnetic alignment apparatus according to claim 24 wherein, said wire substantially forms at least about one complete loop extending about the longitudinal axis thereof.

26. The magnetic alignment apparatus according to claim 22 wherein, said plane is the surface of the substrate facing the die.

27. The magnetic alignment apparatus according to claim 22 wherein, said loop is provided by a three-sided square.

28. The magnetic alignment apparatus according to claim 22 wherein, said loop is substantially circular.

29. The magnetic alignment apparatus according to claim 24 wherein, said first magnetic device is provided by a first permanent magnet.

30. The magnetic alignment apparatus according to claim 29 wherein, said first permanent magnet is oriented such that a first magnetic field vector of said first magnetic field is substantially coaxially aligned with the second magnetic field vector of said second magnetic field when said first reference point and said second reference point are aligned.

31. The magnetic alignment apparatus according to claim 24 wherein, said first magnetic device is provided by an inductor including a wire adapted to substantially extend around a longitudinal axis thereof.

32. The magnetic alignment apparatus according to claim 31 wherein, said wire forms at least about three-quarters of a loop.

33. The magnetic alignment apparatus according to claim 32 wherein, said loop is formed and dimensioned such that that a second magnetic field vector of said second magnetic field is substantially coaxially aligned with the first magnetic field vector when said first reference point and said second reference point are aligned.

34. The magnetic alignment apparatus according to claim 20 further including:

a third magnetic device coupled to the die at a location spaced apart from said first magnetic device, said third magnetic device being adapted to generate a third magnetic field oriented relative to said first reference point of the die; and a fourth magnetic device coupled to the substrate at a location spaced apart from said second magnetic device, said fourth magnetic device being adapted to generate a fourth magnetic field oriented relative to said second reference point of the substrate, said third magnetic field and said fourth magnetic field cooperating, collectively with said first magnetic field and said second magnetic field, to directionally align the first reference point of the die substantially with the second reference point of the substrate relative X, Y coordinates and theta ($\theta$) angle.

35. The magnetic alignment apparatus according to claim 20 further including:

a support structure formed to support said die at an orientation relative said first reference point, and relative said first magnetic field.

36. The magnetic alignment apparatus according to claim 35 wherein, said first magnetic device is mounted to said support structure.

37. The magnetic alignment apparatus according to claim 36 wherein, said support structure includes an alignment device positioned between the support structure and the die, and adapted to align the die relative to said first magnetic field.

38. A magnetic alignment apparatus for aligning a die and a substrate to enable aligned mounting therebetween, said alignment apparatus including:

a support structure formed to support the die at an orientation relative a first reference point thereof, said support structure including a rail assembly cooperating with the substrate for relative aligned lateral movement therebetween substantially along one axis;

a first magnetic device mounted to the support structure, and adapted to generate a first magnetic field having a first magnetic field vector directionally positioned relative to the first reference point and the die; and a second magnetic device mounted to the substrate and adapted to generate a second magnetic field having a second magnetic field vector directionally positioned relative to a second reference point of the substrate, said first magnetic field and said second magnetic field cooperating to directionally align the first magnetic field vector with the second magnetic field vector when the first magnetic device is positioned proximate to the second magnet device such that the first reference point substantially aligns with the second reference point, causing said relative lateral movement along the rail assembly to magnetically align the die with the substrate.

39. The magnetic alignment apparatus according to claim 38 further including:

an alignment device positioned between the support structure and the die, and adapted to align the die relative to said first magnetic device and the first reference point.

40. The magnetic alignment apparatus according to claim 39 further including:

a third magnetic device mounted to the support structure at a location spaced apart from said first magnetic device, said third magnetic device being adapted to generate a third magnetic field having a third magnetic field vector directionally positioned relative to said first reference point and said die; and a fourth magnetic device mounted to the substrate at a location spaced apart from said second magnetic device, said fourth magnetic device being adapted to generate a fourth magnetic field having a fourth magnetic field vector directionally positioned relative to said second reference point of the substrate, said third magnetic field and said fourth magnetic field cooperating, collectively with said first magnetic field and said second magnetic field, to directionally align the first reference point substantially with the second reference point relative X, Y coordinates and theta ($\theta$) angle when the first magnetic field vector of the first magnetic field is substantially coaxially aligned with the second magnetic field vector of said second magnetic field, and when the third magnetic field vector of the third magnetic field is substantially coaxially aligned with the fourth magnetic field vector of said fourth magnetic field.

41. The magnetic alignment apparatus according to claim 40 wherein, said second magnetic device and said fourth magnet device are provided by an inductor each including a wire adapted to substantially extend around respective longitudinal axes thereof.

42. The magnetic alignment apparatus according to claim 41 wherein, each said wire forms a respective loop contained in a plane of said substrate such that a second magnetic field vector of said second magnetic field is substantially coaxially aligned with the respective longitudinal axis of the respective loop, and a fourth magnetic field vector of said fourth magnetic field is substantially coaxially aligned with the respective longitudinal axis of the respective loop.

43. The magnetic alignment apparatus according to claim 42 wherein, said first magnetic device is provided by a first permanent magnet, and said third magnetic device is provided by a third permanent magnet.

44. The magnetic alignment apparatus according to claim 42 wherein, each said wire forms at least about three-quarters of a loop.

45. The magnetic alignment apparatus according to claim 44 wherein, said loop is provided by a three-sided square.

46. The magnetic alignment apparatus according to claim 44 wherein, said loop is substantially circular.

47. The magnetic alignment apparatus according to claim 41 wherein, said first magnetic device and said third magnet device are provided by an inductor each including a wire adapted to substantially extend around respective longitudinal axes thereof.

48. A magnetic alignment apparatus for aligning a die and a substrate to enable aligned mounting therebetween, said alignment apparatus including:

a first group of first magnetic devices coupled to the die on one side thereof, each magnetic device of the first group adapted to generate a respective first magnetic field each being oriented relative to a first reference point and the die;

a second group of second magnetic devices coupled to the substrate, and each adapted to generate a respective second magnetic field each being oriented relative to a second reference point of the substrate and each corresponding to one magnetic device of said first group, a third group of third magnetic devices coupled to the die on an opposite side of the first group, each magnetic device of the third group adapted to generate a respective third magnetic field each being oriented relative to the first reference point and the die;

a fourth group of fourth magnetic devices coupled to the substrate, and each adapted to generate a respective fourth magnetic field each being oriented relative to a second reference point of the substrate and each corresponding to one magnetic device of said third group, wherein the respective first magnetic fields of said first group and the corresponding respective second magnetic fields of the second group, and the respective third magnetic fields of said third group and the corresponding respective fourth magnetic fields of the forth group respectively cooperate to directionally align the first reference point of the die substantially with the second reference point of the substrate relative X, Y coordinates and theta (θ) angle.

49. The magnetic alignment apparatus according to claim 48 wherein, each respective second magnetic device and each respective fourth magnet device is provided by an inductor each including a wire adapted to substantially extend around respective longitudinal axes thereof.

50. The magnetic alignment apparatus according to claim 49 wherein, each respective wire of the second group of magnetic devices and the third group of magnetic devices forms at least three-quarters of a loop.

51. The magnetic alignment apparatus according to claim 50 wherein, each loop of the second group of magnetic devices and of the fourth group of magnetic devices is contained in a plane of said substrate such that, each respective second magnetic field vector of the corresponding second magnetic field is substantially coaxially aligned with a respective longitudinal axis of the respective loop, and each respective fourth magnetic field vector of the corresponding fourth magnetic field is substantially coaxially aligned with a respective longitudinal axis of the respective loop.

52. The magnetic alignment apparatus according to claim 51 wherein, when said first reference point and said second reference point are substantially aligned along the X, Y coordinates and theta (θ) angle, each respective first magnetic field is oriented such that a corresponding first magnetic field vector is substantially coaxially aligned with a respective second magnetic field vector of the second magnetic field, and each respective third magnet field is oriented such that a corresponding third magnetic field vector is substantially coaxially aligned with a respective fourth magnetic field vector of the fourth magnetic field.

53. The magnetic alignment apparatus according to claim 52 wherein, each said first magnetic device is provided by a first permanent magnet, and each said third magnetic device is provided by a third permanent magnet.

54. The magnetic alignment apparatus according to claim 53 further including:

a support structure formed to support said die at an orientation relative to said first reference point, and formed to support each said first permanent magnet and each said third permanent magnet on opposite sides of said die.

55. The magnetic alignment apparatus according to claim 54 wherein, said support structure includes an alignment device positioned between the support structure and the die, and adapted to align the die relative to said first magnetic field.

56. A magnetic alignment apparatus for aligning a die and a substrate to enable aligned mounting therebetween, said alignment apparatus including:

a first magnetic device coupled to the die and adapted to generate a first magnetic field oriented relative to a first reference point of the die;

a second magnetic device coupled to the substrate and adapted to generate a second magnetic field oriented relative to a second reference point of the substrate, said first magnetic field and said second magnetic field cooperating to directionally align the first reference point of the die substantially with the second reference point of the substrate;

a third magnetic device coupled to the die at a location spaced apart from said first magnetic device, said third magnetic device being adapted to generate a third magnetic field oriented relative to said first reference point of the die; and a fourth magnetic device coupled to the substrate at a location spaced apart from said second magnetic device, said fourth magnetic device being adapted to generate a fourth magnetic field oriented relative to said second reference point of the substrate, said third magnetic field and said fourth magnetic field cooperating, collectively with said first magnetic field and said second magnetic field, to directionally align the first reference point of the die substantially with the second reference point of the substrate relative X, Y coordinates and theta (θ) angle.

57. The magnetic alignment apparatus according to claim 56 wherein, said second magnetic device, and said fourth magnet device are each provided by an inductor each including a wire adapted to substantially extend around respective longitudinal axes thereof.

58. The magnetic alignment apparatus according to claim 57 wherein, each said wire forms a respective loop contained in a plane of said substrate such that a second magnetic field vector of said second magnetic field is substantially coaxially aligned with the respective longitudinal axis of the respective loop, and a fourth magnetic field vector of said fourth magnetic field is substantially coaxially aligned with the respective longitudinal axis of the respective loop.

59. The magnetic alignment apparatus according to claim 58 wherein, said first magnetic device is provided by a first permanent magnet, and said third magnetic device is provided by a third permanent magnet.

60. The magnetic alignment apparatus according to claim 59 wherein, when said first reference point and said second reference point are substantially aligned along the X, Y coordinates and theta ($\theta$) angle, said first permanent magnet is oriented such that a first magnetic field vector of said first magnetic field is substantially coaxially aligned with the second magnetic field vector of the second magnetic field, and said third permanent magnet is oriented such that a third magnetic field vector of said third magnetic field is substantially coaxially aligned with the fourth magnetic field vector of the fourth magnetic field.

* * * * *